United States Patent [19]

Bennett, Jr. et al.

[11] Patent Number: 4,489,280

[45] Date of Patent: Dec. 18, 1984

[54] SIGNAL HARMONIC PROCESSOR

[75] Inventors: Clarence L. Bennett, Jr., Groton; Robert D. Short, III, Littleton, both of Mass.

[73] Assignee: Sperry Corporation, New York, N.Y.

[21] Appl. No.: 398,527

[22] Filed: Jul. 15, 1982

[51] Int. Cl.[3] .......................... H03B 1/00; H03K 9/06; H03K 5/22

[52] U.S. Cl. .................................... 328/139; 307/524; 328/138

[58] Field of Search ............... 328/120, 140, 133, 138, 328/139; 307/510, 524, 522; 324/77 B, 78 F, 77 E, 77 G; 455/206, 207, 227, 229, 214; 179/84 VF

[56] References Cited

U.S. PATENT DOCUMENTS

| | | | |
|---|---|---|---|
| 3,548,316 | 12/1970 | Guennou et al. | 455/227 |
| 3,605,029 | 9/1971 | Freedman | 328/139 |
| 3,636,446 | 1/1972 | Genter et al. | 324/78 F |
| 3,731,188 | 5/1973 | Smith | 324/77 E |
| 3,858,117 | 12/1974 | Denny | 328/133 |
| 3,866,151 | 2/1975 | Tajima et al. | 328/149 |
| 3,965,428 | 6/1976 | Katz et al. | 328/147 |
| 4,100,378 | 7/1978 | Claasen et al. | 328/138 |
| 4,107,475 | 8/1978 | Carlgvist et al. | 179/84 VF |
| 4,119,926 | 10/1978 | Frosch et al. | 320/133 |

*Primary Examiner*—Stanley D. Miller
*Assistant Examiner*—Timothy P. Callahan
*Attorney, Agent, or Firm*—Howard P. Terry

[57] ABSTRACT

A signal processor for detecting the presence of two signals whose over-all phase or frequency is related by a known rational number. The first signal of frequency ωM is raised to the $N^{th}$ power, while the second signal of frequency ωN is raised to the $M^{th}$ power. The two raised signals are then correlated, energy detected, and compared against a predetermined threshold to provide an indication when both signals are present. By utilizing the known frequency relationship between the two signals the processor yields enhanced detection performance over that achievable by detection of each signal separately.

18 Claims, 4 Drawing Figures

SIGNAL HARMONIC PROCESSOR

BACKGROUND OF THE INVENTION

1. Field of the Invention

This invention relates generally to signal processing circuits, and more particularly to a signal processing circuit for detecting harmonically related signal of unknown frequency.

2. Description of the Prior Art

In many signal processing problems, the signal to be processed has a secondary component present which is harmonically related to the primary signal. In fact, the presence of this secondary signal may be an important clue to identifying the source of the signal.

The physical processes involved in the emission, reflection, and/or transmission of electromagnetic or acoustical energy often produce secondary signals which are coherently related to the primary signals. For example, any nonlinear transformation of the primary signal or waveform will introduce frequency harmonic components which are phase coherent with the fundamental frequency component. In addition, most complex machinery has rotating parts which are gear-coupled. Therefore, the reflected or radiated energy due to these rotations will have frequencies which are related by the ratio of the rotation rates, or the gear ratio.

Farm machinery, for example, employ rotating parts which often become clogged or jammed with foreign material. Sensors are known which detect the rotation of these rotating parts. Such sensors are described in U.S. Pat. No. 3,757,501, entitled "Static Magnetic Field Metal Detector", issued to C. L. Bennett et al on Sept. 11, 1973. Another sensor is described in U.S. Pat. No. 3,972,156, entitled "Speed-Independent Static Magnetic Field Metal Detector", issued to C. L. Bennett and C. E. Bohman on Aug. 3, 1976. Both patents have been assigned to the assignee of the present invention.

In the case of farm machinery, however, the presence of foreign matter may intermittently load the rotating machinery so that the frequency of rotation is not constant. Changes in the frequency of rotation may also accompany changes in the tractor power take-off speed. Thus the detection equipment must accommodate these speed variations.

Harmonically related signals are also generated by the scattering electromagnetic energy from boundaries of dissimilar metals. The presence of these harmonics provides important information for the classification of targets in radar systems. Another source of information useful for identifying different types of aircraft in radar systems is engine modulation. Electromagnetic energy reflected from an aircraft, or other navigable craft, is modulated by the prop or jet engines. This modulation varies for different types of craft and can be used for classification purposes. Often the modulation produces harmonically related signals. Thus the ability to detect and recognize harmonically related signals is important to all phases of the signal processing art, including but not limited to radar, sonar, and communications applications.

The prior art technique for detecting the presence of harmonically related signals is to filter the incoming signal and thereby separate the harmonically related components, independently envelope detect and integrate each component incoherently, and then apply the independently processed components to a logical AND gate. If the harmonically related components are very stable in frequency, so that the separation filters may have narrow, non-overlapping passbands, then the output of the AND gate will reliably report when both components are present. However, where the incoming frequency is unstable, such as in the case of a farm machine under intermittent crop loading or changes in tractor power takeoff speed, the prior art device will no longer function as intended. With the prior art device, in order to accommodate speed variations, the filter bandwidths must be substantially wider with the concomitant result of poorer detection sensitivity.

SUMMARY OF THE INVENTION

The present invention provides a method and apparatus for coherently detecting the presence of two signals which are harmonically related in frequency by a known rational number. The respective frequencies of the two signals need not be known a priori, nor must they remain constant over time so long as the harmonic relationship is retained. The method and apparatus yields an enhanced detection performance over that achievable by detection of each signal separately.

Briefly, the invention comprises a method for detecting or processing an incoming signal consisting of first and second harmonically related signals whose frequency or phase is related by a known rational number M/N. The method comprises filtering the incoming signal to pass the first of said components, and then mathematically raising this component to the $N^{th}$ power. At the same time, the incoming signal is filtered to pass the second of said components, and this component is mathematically raised to the $M^{th}$ power. The two mathematically raised signals are then correlated, as by being multiplied together and integrated coherently over time. Next the resultant integrated signal is energy detected, as by envelope detection, and compared with a threshold to ascertain the presence of the sought after signal pair. The invention provides an output report signal when the harmonically related signal pair is present, and produces no output if either one or both of the signals in the pair are absent. The invention allows for an arbitrarily long coherent integration time, if desired, up to the coherent time of the two harmonically related components in the pair. Thus for signals with long coherence times the invention will permit a major improvement in the detectability over that possible with current devices.

DESCRIPTION OF THE PREFERRED EMBODIMENT

Figure 1:
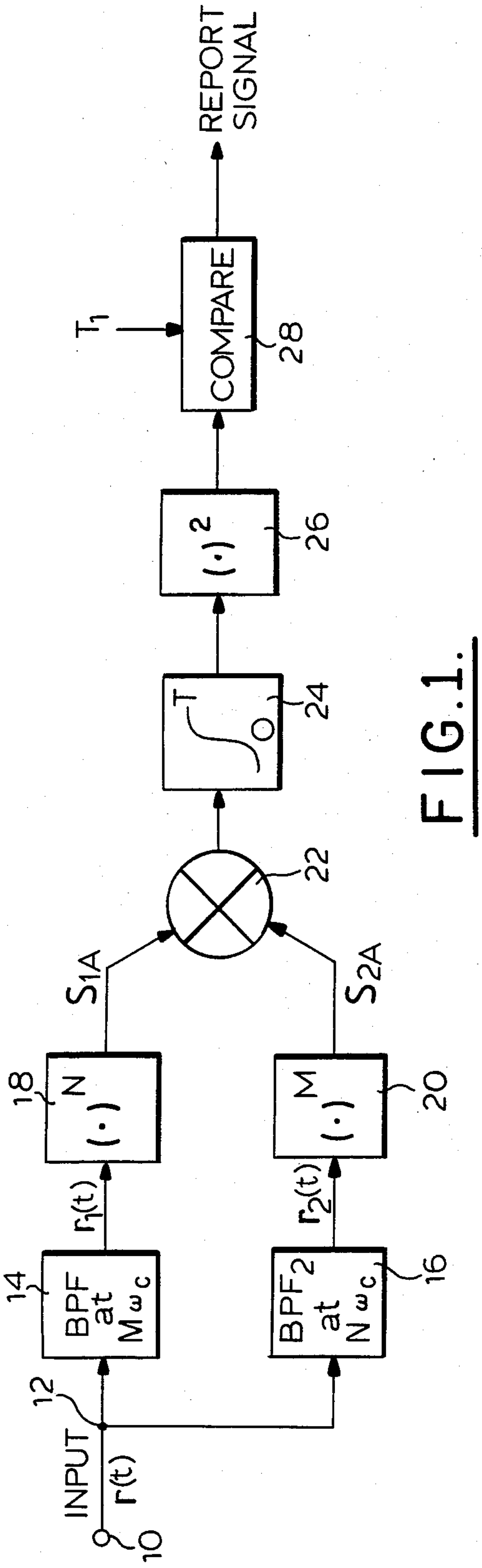
FIG. 1 is a block diagram illustrating one embodiment of the invention based on time domain principles.

With reference to FIG. 1 the invention is shown in a first embodiment based on the time domain analysis. The invention comprises an input port 10 into which is introduced the signal to be processed. In order to illustrate the concept of the invention, we may express the incoming signal, r(t), by the following equation:

$$r(t) = \begin{cases} S_1(t) + S_2(t) + n(t); \text{ signals present} \\ n(t); \text{ no signal} \end{cases} \quad (1)$$

In equation 1 we define the signal pairs $S_1(t)$ and $S_2(t)$ to be harmonically related if $$S_1(t)=A_1 \cos M[\phi(t)+\omega_c t] \quad (2)$$

$$S_2(t)=A_2 \cos N[\phi(t)+\omega_c t] \quad (3)$$

where $\phi/(t)$ is the signal phase angle or phase reference, $M\omega_c$ is the center frequency of $S_1(t)$, $N\omega_c$ is the center frequency of $S_2(t)$, $A_1$ and $A_2$ are the respective amplitudes of $S_1(t)$ and $S_2(t)$, and M and N are integers. As used herein, the term over-all phase represents the sum $[\phi(t)=K\omega_c t]$ as distinguished from the phase angle or phase reference $\phi(t)$. These signals occur, for instance, in the farm machine when gears having a different number of teeth modulate a magnetic field. These signals also occur in nature whenever a signal is transformed by some non-linear process. The incoming signal r(t), as will be seen from equation (1), also includes a certain amount of additive noise n(t).

Equations (1), (2), and (3) thus define the general case of an incoming signal comprising first and second signals wherein the over-all phase or frequency is related by a known rational number M/N. The signal may arise in the context of rotating machinery, or in the more general case whenever a signal is transformed by a non-linear process. Thus, the invention has wide applicability in all phases of the signal processing art. It will also be recognized that the incoming signal r(t) may also represent a signal having harmonic components related in frequency by some integral multiple of a fundamental frequency. For example, by setting M equal to 1 and N equal to 2, the incoming signal r(t), comprises components which are an octave apart. It will be appreciated that an infinite number of other possibilities exist.

With continued reference to FIG. 1, the incoming signal is split into two signal paths at node 12, a first signal path being applied to a first bandpass filter 14 and a second signal path being applied to a second bandpass filter 16. Bandpass filter 14 has a passband centered at substantially the center frequency of signal component $S_1(t)$, that frequency being $M\omega_c$. Bandpass filter 16 has a passband centered substantially at the center frequency of signal component $S_2(t)$, that frequency being $N\omega_c$. Bandpass filter 14 thus passes the $S_1(t)$ component and any noise within the passband thereby producing a filtered signal represented by the following equation:

$$r_1(t)=S_1(t)+n_1(t) \quad (4)$$

Likewise, bandpass filter 16 passes the $S_2(t)$ component and any noise within the passband of that filter, thereby producing a second filtered signal given by the following equation:

$$r_2(t)=S_2(t)+n_2(t) \quad (5)$$

If the bandpass filters 14 and 16 are non-overlapping in frequency, the filtered noise components $n_1(t)$ and $n_2(t)$ are independent noise processes. The separation of the noise spectrum into two independent processors is quite beneficial since these processes are statistically uncorrelated.

Next, the first filtered signal, $r_1(t)$, output of bandpass filter 14 is applied to a non-linear, power law device 18 which serves to mathematically raise the first filtered signal, $r_1(t)$, to the $N^{th}$ power. For instance, if $N=2$, a square law device such as a diode may be used. If $N=3$, the filtered signal $r_1(t)$ can be multiplied by itself three times using analog or digital means, and so forth. Power law device 18 thus produces a first raised signal $S_{1A}(t)$ which may be expressed as follows:

$$S_{1A}(t) = [r_1(t)]^N = S_1^N(t) + \sum_{a=1}^{N-1}\left[\frac{N!}{a!(N-a)!} S_1^a(t) n_1^{N-a}(t)\right] + n_1^N(t) \quad (6)$$

Equation 6 will be recognized as a binomial expansion, the first term of which $S_1^N(t)$, may be expressed in terms of equation (2) as follows:

$$S_1^N(t)=A_1^N \cos^N(M\phi(t)+M\omega_c t) \quad (7)$$

It is well known that equation (7) contains a component of the form $$S_{1A}^N(t) = \frac{A_1^N \cos(NM\omega_c t + NM\phi(t))}{2^{N-1}} \quad (8)$$

In a similar fashion the filtered component, $r_2(t)$, is applied to a second non-linear, power law device 20 which mathematically raises that signal to the $M^{th}$ power, thereby producing a second raised signal $S_{2A}(t)$ which contains a term of the form $$A_2^M \frac{\cos(MN\omega_c(t))}{2^{M-1}}.$$

Power law device 20 may be implemented in a fashion similar to power law device 18 and provides initially the same function, differing only in the respect of raising to the M power instead of the N power.

The raised signals $S_{1A}$ and $S_{2A}$ are next applied to a multiplier 22 where the product is produced giving a constant term proportional to $A_1^N A_2^M$ plus time varying terms which contain sum frequency terms and noise related terms. This product signal is in turn integrated in integrator 24 which serves to remove all time varying terms. It will be seen that the steps of multiplying in multiplier 22 and integrating through integrator 24 serve to correlate the filtered signals $S_{1A}$ and $S_{2A}$, which have in common a term of the form $\cos(MN\omega_c(t))$. Integration in integrator 24 may, if desired, be for an arbitrarily long coherent integration time, limited only by the coherent time of the filtered signal $S_{1A}$ and $S_{2A}$.

The correlated signal from integrator 24 is applied to an energy detector 26, such as an envelope detector or square law device. The energy detector 26 provides a signal representing the energy contained within the correlated signal applied thereto. The energy detected signal is compared in comparator 28 against a threshold $T_1$ to ascertain the presence of the sought after signal pair. If either $S_1(t)$ or $S_2(t)$ or both are absent from the incoming signal r(t), comparator 28 produces no output report signal. Since any incoming noise is filtered into independent frequency ranges, the circuit will not produce an output report signal when only noise is present at the input. Only for the case where both signals $S_1(t)$ and $S_2(t)$ are present will a report signal be generated by comparator 28.

Although the foregoing has described the invention in the context of two constant frequency signals whose phase is related by a known rational member M/N, the invention works equally well with signals whose frequencies vary with time, provided the phase of those signals remains related by some known rational number M/N.

Figure 2:
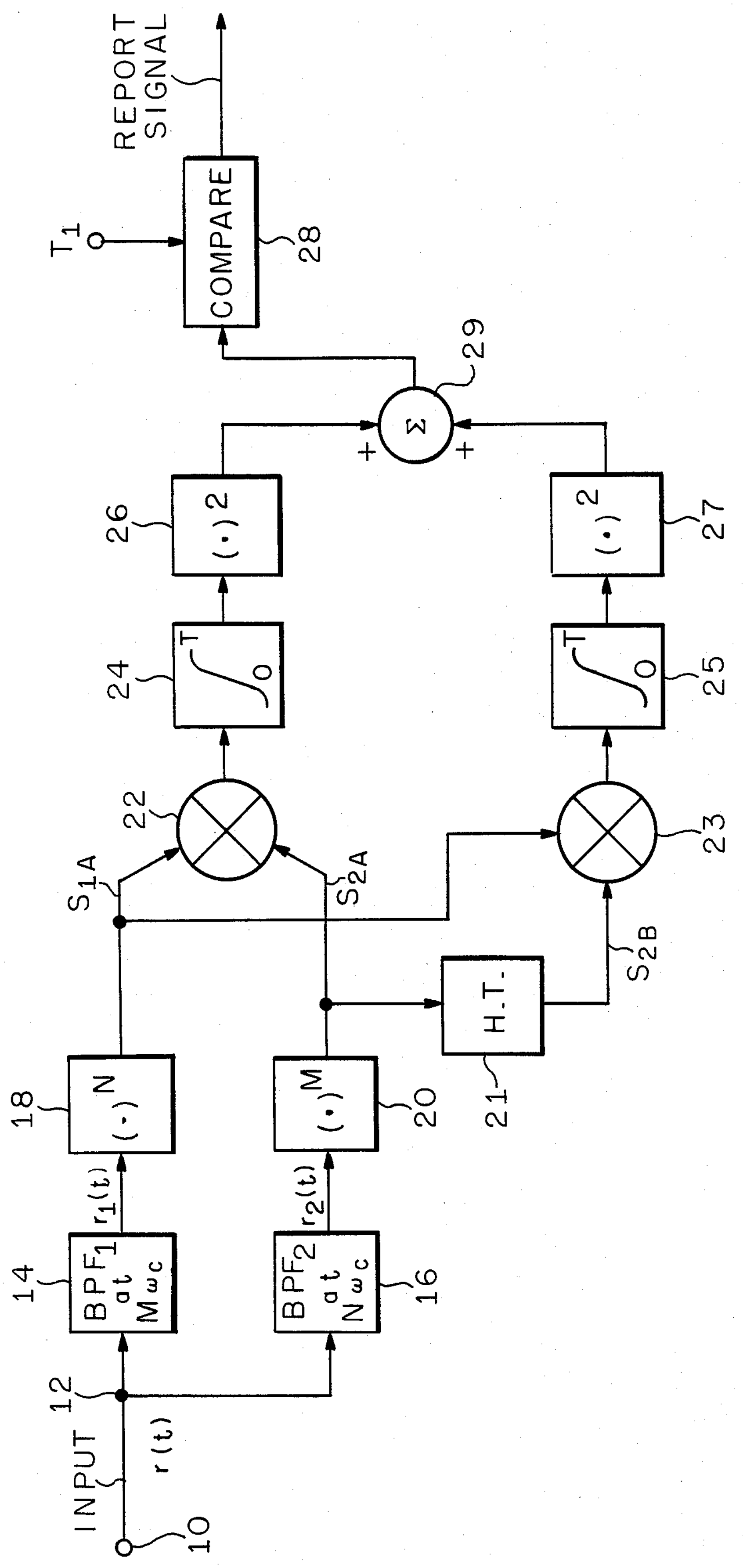
FIG. 2 is a block diagram illustrating a second embodiment of the invention for the case where the signals are related by an unknown constant phase and based on time domain principles.

A second embodiment of the invention is shown in FIG. 2 for use in the case where the signals are related as given in equation (2) and equation (3) except that there is an unknown constant phase between them. An example of this is:

$$S_1(t)=A_1\cos\{M[\phi(t)+\omega_c t]\} \quad (2a)$$

$$S_2(t)=A_2\cos\{N[\phi(t)+\omega_c t]+\theta\} \quad (3a)$$

where $\theta$ is an unknown constant.

If this signal set is applied to the device in FIG. 1, then the output of the envelope detector 26 will be proportional to $(A_1^N A_2^M \cos\theta)^2$. In the unfortunate event that $\theta=\pm 90°$, the output of envelope detector 26 in FIG. 1 will be zero even if the two signals are present. The apparatus shown in FIG. 2 obviates this difficulty. This represents an expansion of the embodiment shown in FIG. 1. In FIG. 2, a parallel channel is used for multiplying 23, integrating 25, and envelope detecting 27. The output of power law device 20 is passed through a commercially available Hilbert transform 21 providing $S_{2B}$ as one input to the multiplier 23. The other input to multiplier 23 is $S_{1A}$ coming directly from power law device 18. (A Hilbert Transform is a 90° phase shift in the frequency domain and would be given by $$S_{2B}=F^{-1}\{jF\{S_{2A}\}\}$$

where F is a Fourier Transform.

$F^{-1}$ is an inverse Fourier Transform. In practice, where $S_{2A}$ is a narrow band signal, the Hilbert transform is easily implementable by means of a 90° phase shifter). Hence, the output of envelope detector 27 will be proportional to $(A_1^N A_2^M \sin\theta)^2$ and the output of the summer 29 will be proportional to $(A_1^N A_2^M)^2$ and independent of the unknown constant phase $\theta$.

Figure 3B:
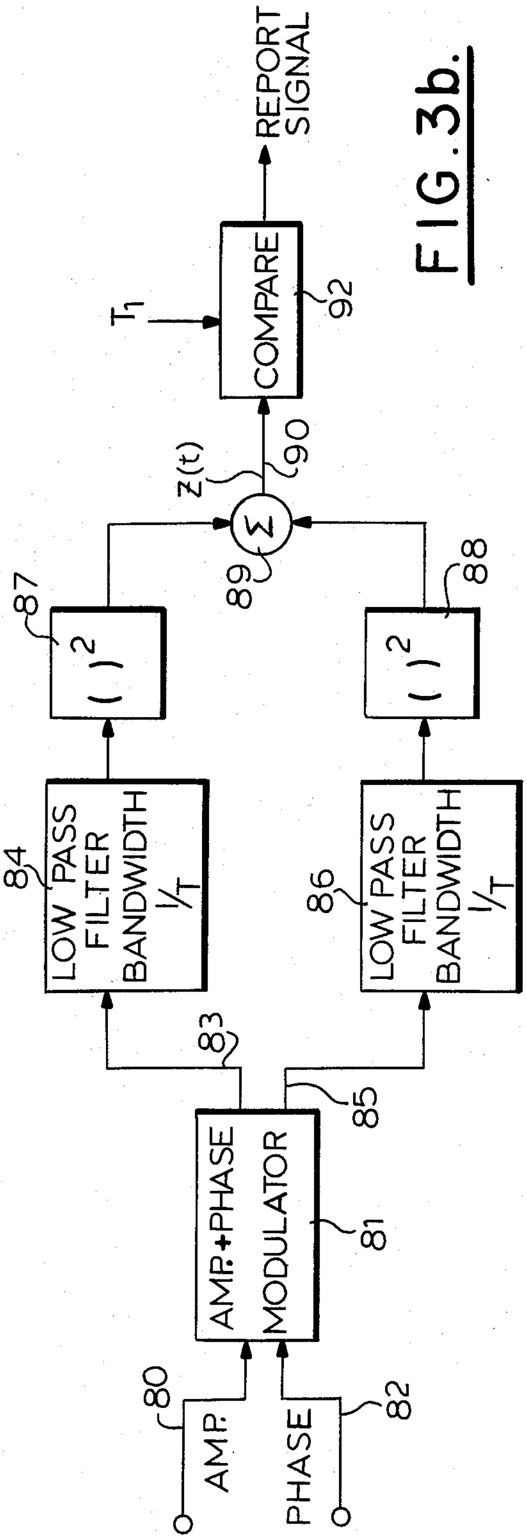
FIGS. 3*a* and 3*b* are block diagrams illustrating further embodiments of the invention based on frequency domain principles.
Figure 3A:
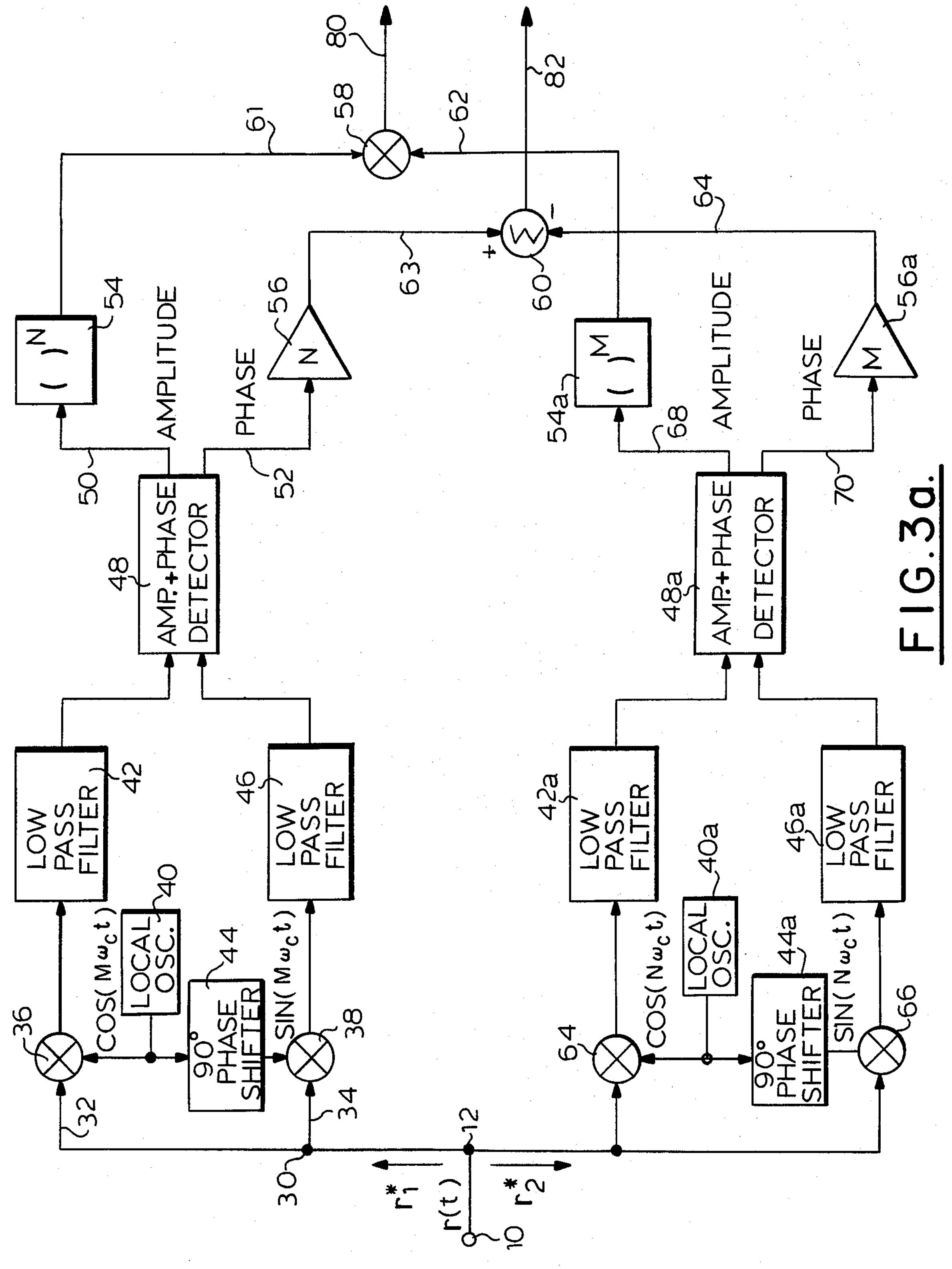

A third embodiment of the invention is illustrated in FIG. 3, which may be understood in terms of frequency domain principles. Referring to FIG. 3, the incoming signal r(t) is applied to an input port 10 and thereafter split into two signal paths at node 12. In FIG. 3, the signal paths are labeled $r_1$* and $r_2$*. Both of these signal paths are processed in a similar fashion therefor only the signal processing path $r_1$* will be discussed in detail. It will be understood that emanating from node 12, both signal paths carry the input signal r(t).

The input signal r(t) proceeding along signal path $r_1$* is split again at node 30 into two signal paths and applied via leads 32 and 34 to a first multiplier 36 and a second multiplier 38, respectively. In multiplier 36, the input signal is multiplied by, or beat against, a signal of frequency $M\omega_c$, which may be produced by a local oscillator 40. The output of multiplier 36 produces a signal which includes a term reflecting the in-phase component of signal $S_1(t)$. Recall from equation (2) that signal $S_1(t)$ is that portion of the incoming signal at frequency $M\omega_c$. The output of multiplier 36 is applied to a low pass filter 42 which extract the in-phase term from the output product of multiplier 36.

Similarly, the input signal r(t) is applied to multiplier 38 where it is multiplied by a signal from local oscillator 40 which has been phase shifted by 90° in phase shifter 44. The output of multiplier 38 produces a signal which includes a phase quadrature term of signal $S_1(t)$, which term is extracted by low pass filter 46. The in-phase term from low pass filter 42 and the quadrature term from low pass filter 46 are applied to an amplitude and phase detector 48. These applied signals may be viewed as cartesian coordinates or as real and imaginary components of the input signal r(t). The amplitude and phase detector 48 converts these cartesian coordinates to polar coordinates, producing an amplitude signal on lead 50 and a phase signal on lead 52. The amplitude signal on lead 50 is raised to the $N^{th}$ power by a non-linear, power law device 54, and the phase signal on lead 52 is multiplied or amplified by a gain factor N in amplifier 56. The output of power law device 54 is applied via lead 61 to a multiplier 58, and the output of amplifier 56 is applied via lead 63 to a summing terminal of a summing device 60.

Also applied to multiplier 58 is a second signal on lead 62 which is derived from signal path $r_2$* in a manner identical to the manner in which the signal on lead 61 was derived, one exception being that the second signal path $r_2$* involves multiplying the input signal in multipliers 64 and 66 by a signal of frequency $N\omega_c$ (instead of $M\omega_c$) and the resultant polar amplitude and phase signals on leads 68 and 70 are respectively raised to the $M^{th}$ power and multiplied by a gain factor M (instead of being raised to $N^{th}$ power and multiplied by gain factor N). Also applied to summing device 60 is a second phase signal on lead 64. The phase signal on lead 64 is applied to an inverting terminal of summing amplifier 60. Thus, the phase signals on leads 63 and 64 are subtracted from one another.

The output product of multiplier 58 is applied via lead 80 to the input of an amplitude and phase modulator 81. Likewise, the output of summing device 60 is applied via lead 82 to the amplitude and phase modulator 81. The amplitude and phase modulator converts the amplitude and phase information on leads 80 and 82 from polar form to rectangular or cartesian form in the well known fashion. Expressed in cartesian form, the amplitude and phase information may be viewed as a complex number comprising real and imaginary components. The real component is conveyed on lead 83 to the input of a low pass filter 84 having bandwidth l/T. The imaginary component is conveyed on lead 85 to a low pass filter 86 having bandwidth l/T. The outputs of low pass filters 84 and 86 are applied, respectively, to energy detecting devices 87 and 88, which may be square law devices such as diodes as well as other well known envelope detecting circuits. The outputs of energy detectors 87 and 88 are summed in a summing junction 89 and the summed output is applied via lead 90 to a comparator 92. Comparator 92 compares the applied signal on lead 90 with a threshold level $T_1$ and produces a report signal when the energy of the applied signal exceeds the predetermined threshold level.

In operation, the embodiment depicted in FIG. 3, like the first and second embodiments, receives the incoming signal and separates it into two components on the basis of frequency, where M is used to describe the frequency of a first signal and N is used to describe the frequency of a second signal constituting the two components. The first component, associated with frequency M, is processed through signal path $E_1$* and the second frequency, associated with frequency N, is processed through the signal path $r_2$*. Except where otherwise noted both of these signals are processed in the same manner and components bearing like reference numerals are implemented and operate in the same fashion for both signal paths. For example, low pass filter 42 in the $r_1$* signal path and low pass filter 42a in the $r_2$* signal path are identical. Likewise, amplitude and phase detectors 48 and 48a are identical; phase shifters 44 and 44a are identical. Local oscillators 40 and 40a are substantially identical, except that local oscillator 40 produces a frequency proportional to M, whereas local oscillator 40a produces a frequency proportional to N. Also, power law devices 54 and 54a are identical except that device 54 raises incoming signals to the $N^{th}$ power, whereas device 54a raises incoming signals to the $M^{th}$ power; also gain scaling amplifiers 56 and 56a are identical except that device 56 provides a gain factor of N, while device 56a provides a gain factor of M.

As stated earlier, multipliers 36 and 38, local oscillator 40, and phase shifter 44 produce the in-phase and quadrature components of the signal of frequency M. Low pass filters 42 and 46 extract these components, and the amplitude and phase detector 48 convert these component signals to polar form. The signals on leads 50 and 52 thus may be expressed by equation (4), stated above, where it will be understood that the signal term $S_1(t)$ is a complex number now in polar form. By raising the amplitude of complex polar number $S_1(t)$ by the factor N and multiplying its phase by the factor N, elements 54 and 56 produce the signal $r_1^N(t)$.

By a similar reasoning the circuit path $r_2$* produces the signal $r_2^M(t)$. By multiplying the amplitudes of $r_1^N(t)$ and $r_2^M(t)$ while subtracting their respective phases, the first mentioned term is in effect multiplied by the complex conjugate of the second mentioned term. The resultant product is then reconverted to rectangular or cartesian form in amplitude and phase modulator 81, where the real portion of the complex number is conveyed on lead 83 and the imaginary portion is conveyed on lead 85. Low pass filters 84 and 86 provide integration and averaging of the signal over the interval T. Thus, the output of summing junction 89 may be given by the following equation:

$$Z(T) = \frac{1}{T} \int_0^T r_1^N(t) \cdot \overline{r_2^M(t)}\, dt \tag{9}$$

In equation (9), the $\overline{r_2^M(t)}$ notation denotes the complex conjugate of that term. As the integration interval T increases towards infinity the function Z(T) approaches the limit as follows:

$$\lim_{T \to \infty} Z(T) = \begin{cases} A_1^N A_2^M; & \text{both signals present} \\ 0; & \text{signals not present} \end{cases}$$

While the invention has been described in its preferred embodiments, it is to be understood that the words that have been used are words of description rather than of limitation and that changes within the purview of the appended claims may be made without departing from the true scope and spirit of the invention in its broader aspects.

We claim:

1. A method for detecting, in an incoming signal, the common presence of a first signal of frequency ωM and a second signal of frequency ωN related by a known rational number M/N comprising
   (a) filtering the incoming signal to extract said first signal;
   (b) raising said first signal to the $N^{th}$ power, thereby providing a first raised signal;
   (c) filtering the incoming signal to extract said second signal;
   (d) raising said second signal to the $M^{th}$ power, thereby providing a second raised signal;
   (e) correlating the first raised signal with the second raised signal, thereby producing a correlated signal;
   (f) detecting the energy of said correlated signal, thereby providing a detected signal; and
   (g) producing a report signal, indicating the common presence of said first and second signals, when the energy of said correlated signal exceeds a predetermined level.

2. The method of claim 1 wherein said step of filtering the incoming signal to extract said first signal comprises filtering said incoming signal through a first bandpass filter whose pass band is centered substantially about said frequency ωM.

3. The method of claim 1 wherein said step of filtering the incoming signal to extract said second signal comprises filtering said incoming signal through a second bandpass filter whose pass band is centered substantially about said frequency ωN.

4. The method of claim 1 wherein said step of filtering the incoming signal to extract said first signal comprises filtering said incoming signal through a first bandpass filter having a first pass band, and wherein said step of filtering the incoming signal to extract said second signal comprises filtering said incoming signal through a second bandpass filter having a second pass band not overlapping said first pass band.

5. The method of claim 1 wherein said step of correlating the first raised signal with the second raised signal comprises multiplying said first and second raised signals, thereby providing a product signal and integrating said product signal over a preselected time interval, thereby providing an integrated signal.

6. The method of claim 1 wherein said step of correlating the first raised signal with the second raised signal comprises averaging said first and second raised signals.

7. The method of claim 1 wherein said step of detecting the energy of said correlated signal comprises envelope detecting said correlated signal.

8. The method of claim 1 wherein said step of producing a report signal comprises generating a threshold signal of predetermined level and comparing said detected signal with said threshold signal.

9. The method of claim 1 further comprises generating a first reference signal and converting said first signal into a first amplitude signal and a first phase signal, said first amplitude and phase signals representing the amplitude and phase, respectively, of said first signal in relation to said first reference signal.

10. The method of claim 1 further comprising generating a second reference signal and converting said second signal into a second amplitude signal and a second phase signal, said second amplitude and phase signals representing the amplitude and phase, respectively, of said second signal in relation to said second reference signal.

11. The method of claim 9 further comprising raising said first amplitude signal to the $N^{th}$ power, thereby providing a first raised amplitude signal, and multiplying said first phase signal by the number N, thereby providing a first raised phase signal, said first raised amplitude signal and said first raised phase signal constituting a polar representation of said first raised signal.

12. The method of claim 10 further comprising raising said second amplitude signal to the $M^{th}$ power, thereby providing a second raised amplitude signal, and multiplying said second phase signal by the number M, thereby providing a second raised phase signal, said second raised amplitude signal and said second raised phase signal constituting a polar representation of said second raised signal.

13. The method of claim 1 further comprising generating a first reference signal and converting said first signal into a first amplitude signal and a first phase signal, said first amplitude and phase signal representing the amplitude and phase, respectively of said first signal in relation to said first reference signal, and generating a second reference signal and converting said second signal into a second amplitude signal and a second phase signal, said second amplitude and phase signals representing the amplitude and phase, respectively, of said second signal in relation to said second reference signal.

14. The method of claim 13 further comprising raising said first amplitude signal to the $N^{th}$ power, thereby providing a first raised amplitude signal, and multiplying said first phase signal by number N, thereby providing a first raised phase signal, and raising said second amplitude signal to the $M^{th}$ power thereby providing a second raised amplitude signal, and multiplying said second phase signal by the number M, thereby providing a second raised phase signal, said first raised amplitude signal and said first raised phase signal constituting a polar representation of said first raised signal and said second raised amplitude signal and said second raised phase signal constituting a polar representation of said second raised signal.

15. The method according to claim 14 comprising multiplying the first and second raised amplitude signals, thereby providing a product signal, and subtracting said first and second raised phase signals, thereby providing a difference signal, said product signal and said difference signal constituting terms of a polar signal.

16. The method according to claim 15 further comprising converting said polar signal into a first cartesian signal and a second cartesian signal, filtering said first and second cartesian signals, thereby providing first and second filtered cartesian signals, detecting the energy of said first and second filtered cartesian signals, thereby providing first and second detected cartesian signals, and summing said first and second detected cartesian signals, thereby providing a summed signal constituting said detected signal.

17. The method according to claim 1 further comprising phase shifting said second raised signal by substantially ninety degrees thereby producing an orthogonal signal, correlating said first raised signal with said orthogonal signal thereby producing a second correlated signal, and producing a report signal when the energy of said second correlated signal exceeds a predetermined level.

18. The method according to claim 17 wherein the step of phase shifting said second raised signal comprises producing the Hilbert Transform of said second raised signal.

* * * * *